(12) United States Patent
Nishisaka et al.

(10) Patent No.: US 9,667,174 B2
(45) Date of Patent: May 30, 2017

(54) CERAMIC ELECTRONIC COMPONENT

(71) Applicant: Murata Manufacturing Co., Ltd., Nagaokakyo-shi, Kyoto-fu (JP)

(72) Inventors: Yasuhiro Nishisaka, Nagaokakyo (JP); Satoshi Matsuno, Nagaokakyo (JP); Tetsuya Kisumi, Nagaokakyo (JP); Yoko Okabe, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 276 days.

(21) Appl. No.: 14/191,480

(22) Filed: Feb. 27, 2014

(65) Prior Publication Data

US 2014/0292141 A1 Oct. 2, 2014

(30) Foreign Application Priority Data

Mar. 26, 2013 (JP) ................................ 2013-063355
Dec. 27, 2013 (JP) ................................ 2013-273078

(51) Int. Cl.
*H01L 41/053* (2006.01)
*H02N 2/00* (2006.01)
(Continued)

(52) U.S. Cl.
CPC ........... *H02N 2/00* (2013.01); *H01F 17/0013* (2013.01); *H01L 41/0471* (2013.01);
(Continued)

(58) Field of Classification Search
CPC . H01L 41/053; H01L 41/0533; H01L 41/047; H01L 41/0471; H01L 41/0472
(Continued)

(56) References Cited

U.S. PATENT DOCUMENTS

2001/0017503 A1* 8/2001 Kitahara .............. B41J 2/14274
310/328
2007/0057237 A1* 3/2007 Ohtani ..................... H01B 1/16
252/500

(Continued)

FOREIGN PATENT DOCUMENTS

JP         2001-338830 A    12/2001
JP         2002-56717 A      2/2002
(Continued)

OTHER PUBLICATIONS

Official Communication issued in corresponding Korean Patent Application No. 10-2014-0034754, mailed on Aug. 18, 2015.
(Continued)

*Primary Examiner* — Derek Rosenau
(74) *Attorney, Agent, or Firm* — Keating & Bennett, LLP

(57) ABSTRACT

A ceramic electronic component includes a ceramic body, inner electrodes, a glass coating layer, and outer electrodes. The glass coating layer extends from an exposed portion of one of the inner electrodes at a first end surface to a first principal surface. The outer electrodes are each constituted by a plating film disposed directly above the glass coating layer. The glass coating layer includes a glass medium and metal powder particles that define conductive paths. The metal powder particles have an elongated or substantially elongated shape and are dispersed in the glass medium. The dimension of a portion of the glass coating layer located on the first principal surface in the length direction, is larger than that of a portion of the glass coating layer located on the first end surface in the thickness direction.

20 Claims, 14 Drawing Sheets

(51) Int. Cl.
  *H01F 17/00*   (2006.01)
  *H01L 41/047*  (2006.01)
  *H01C 7/00*    (2006.01)

(52) U.S. Cl.
  CPC ...... *H01L 41/0472* (2013.01); *H01L 41/0533* (2013.01); *H01C 7/008* (2013.01)

(58) Field of Classification Search
  USPC .......................................................... 310/328
  See application file for complete search history.

(56) References Cited

U.S. PATENT DOCUMENTS

| | | | |
|---|---|---|---|
| 2009/0284896 A1 | 11/2009 | Sakaguchi et al. | |
| 2011/0001399 A1* | 1/2011 | Oguni | H01C 1/14 310/366 |

FOREIGN PATENT DOCUMENTS

| | | | |
|---|---|---|---|
| JP | 2002-246257 A | 8/2002 |
| JP | 2002-298649 A | 10/2002 |
| JP | 2003-257244 A | 9/2003 |
| JP | 2003-323817 A | 11/2003 |
| JP | 2004-128328 A | 4/2004 |
| JP | 2005-228610 A | 8/2005 |
| JP | 2009-253010 A | 10/2009 |
| JP | 2011-100834 A | 5/2011 |
| JP | 2012-253077 A | 12/2012 |

OTHER PUBLICATIONS

Official Communication issued in corresponding Japanese Patent Application No. 2013-273078, mailed on Mar. 8, 2016.
Official Communication issued in corresponding Korean Patent Application No. 10-2014-0034754, mailed on Apr. 20, 2016.
Official Communication issued in corresponding Japanese Patent Application No. 2013-273078, mailed on Feb. 7, 2017.

* cited by examiner

CERAMIC ELECTRONIC COMPONENT

BACKGROUND OF THE INVENTION

1. Field of the Invention

The present invention relates to a ceramic electronic component.

2. Description of the Related Art

Hitherto, ceramic electronic components such as ceramic capacitors have been used for electronic devices such as cellular phones and portable music players. For example, as described in Japanese Unexamined Patent Application Publication No. 2011-100834, a ceramic electronic component generally includes a ceramic body having a surface at which an end portion of each of inner electrodes is exposed and outer electrodes disposed so as to cover a portion of the ceramic body in which the inner electrode is exposed.

However, in ceramic electronic components in which side surface electrodes of terminal electrodes are formed so as to extend to near a central portion of a capacitor body and have a large length as illustrated in FIG. 1 of Japanese Unexamined Patent Application Publication No. 2011-100834, for example, when the terminal electrodes are formed by a dipping method in which the capacitor body is dipped into a conductive paste containing conductive metal powder, glass frit, and the like and then the capacitor body is lifted up out of the conductive paste, the surface tension at each of the side surface electrodes of the terminal electrodes increases as the length of each of the side surface electrodes of the terminal electrodes increases. Therefore, a conductive paste is easily held on side surfaces (side-surface-electrode-forming portions) of the capacitor body. This decreases the amount of conductive paste in ridge portions of the capacitor body. As a result, the conductive paste cannot be sufficiently applied to the ridge portions of the capacitor body and, in some cases, the terminal electrodes are not appropriately formed in the ridge portions of the capacitor body. This poses a problem in that moisture and the like enter the capacitor body through a portion in which the terminal electrodes are not formed, which degrades the moisture resistance.

In recent years, there has been a demand for decreasing the size and thickness of electronic components. Such a decrease in the size and thickness requires a decrease in the thickness of terminal electrodes formed on principal surfaces of a capacitor body. To decrease the thickness of such terminal electrodes, it is desirable to decrease the viscosity of a conductive paste. However, a decrease in the viscosity of the conductive paste significantly poses the above problem.

SUMMARY OF THE INVENTION

Accordingly, preferred embodiments of the present invention provide a thin ceramic electronic component having excellent moisture resistance.

A ceramic electronic component according to a preferred embodiment of the present invention includes a ceramic body, an inner electrode, a glass coating layer, and an outer electrode. The ceramic body includes first and second principal surfaces, first and second side surfaces, and first and second end surfaces. The first and second principal surfaces extend in a length direction and a width direction. The first and second side surfaces extend in the length direction and a thickness direction. The first and second end surfaces extend in the width direction and the thickness direction. The inner electrode is disposed inside the ceramic body and includes an exposed portion at the first end surface. The glass coating layer is disposed so as to extend from the exposed portion of the inner electrode at the first end surface to the first principal surface. The outer electrode is constituted by a plating film disposed directly above the glass coating layer. The glass coating layer contains a glass medium and metal powder particles. The metal powder particles form conductive paths which electrically connect the inner electrode and the outer electrode and are dispersed in the glass medium. The dimension of a portion of the glass coating layer in the length direction, the portion being located on the first principal surface, is larger than the dimension of a portion of the glass coating layer in the thickness direction, the portion being located on the first end surface. The metal powder particles include metal powder particles having an elongated or substantially elongated shape.

In a specific aspect of a ceramic electronic component according to a preferred embodiment of the present invention, the metal powder particles having an elongated or substantially elongated shape are preferably disposed in a portion of the glass coating layer above a ridge portion defined by the first principal surface and the first end surface.

In another specific aspect of a ceramic electronic component according to a preferred embodiment of the present invention, the glass coating layer preferably has a thickness such that at least one of the metal powder particles having an elongated or substantially elongated shape and disposed in the portion of the glass coating layer above the ridge portion is exposed at a surface of the glass coating layer.

In still another specific aspect of a ceramic electronic component according to a preferred embodiment of the present invention, the metal powder particles preferably have at least one shape selected from a flat or substantially flat shape, a scaly or substantially scaly shape, a rod-like or substantially rod-like shape, and a needle-like or substantially needle-like shape.

In still another specific aspect of a ceramic electronic component according to a preferred embodiment of the present invention, the metal powder particles having an elongated or substantially elongated shape preferably have an aspect ratio of about 4 or more and a minor axis length of about 1.5 µm or less, for example.

In still another specific aspect of a ceramic electronic component according to a preferred embodiment of the present invention, at least one of the conductive paths is preferably formed by bringing the metal powder particles into contact with each other, the metal powder particles being arranged in the thickness direction of the glass coating layer.

In still another specific aspect of a ceramic electronic component according to a preferred embodiment of the present invention, the metal powder particles preferably do not contain, as a main component, a metal contained in the inner electrode as a main component.

In still another specific aspect of a ceramic electronic component according to a preferred embodiment of the present invention, the metal powder particles preferably include a core portion including copper.

In still another specific aspect of a ceramic electronic component according to a preferred embodiment of the present invention, the glass coating layer preferably has a thickness of about 1 µm to about 10 µm, for example.

In still another specific aspect of a ceramic electronic component according to a preferred embodiment of the present invention, in a cross section of the glass coating layer in the thickness direction, surfaces of the metal powder particles that define the conductive paths may be nonlinear.

In still another specific aspect of a ceramic electronic component according to a preferred embodiment of the present invention, the conductive paths may include a plurality of relatively narrow portions and a plurality of relatively thick portions.

In still another specific aspect of a ceramic electronic component according to a preferred embodiment of the present invention, a portion of the plating film in contact with the glass coating layer may be a copper plating film or a nickel plating film.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
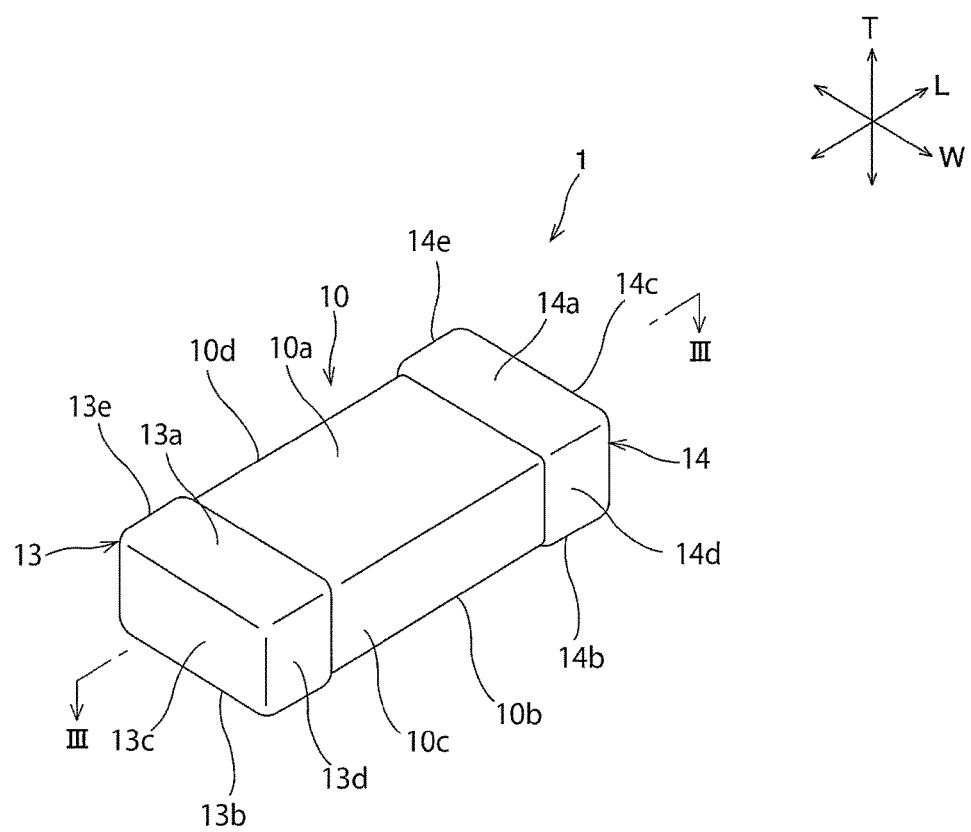
FIG. 1 is a schematic perspective view of a ceramic electronic component according to a first preferred embodiment of the present invention.

Examples of the preferred embodiments of the present invention will now be described. The following preferred embodiments are merely examples. The present invention is not limited to the following preferred embodiments.

In each of the drawings referred to in the preferred embodiments and the like, members having the same or substantially the same functions are denoted by the same reference numerals. The drawings referred to in the preferred embodiments and the like are illustrated schematically. The dimensional ratios and the like of the elements illustrated in the drawings may differ from those of the actual elements. The dimensional ratios and the like of the elements may also differ between the drawings. Specific dimensional ratios and the like of the elements are to be determined in consideration of the following description.

First Preferred Embodiment

Figure 2:
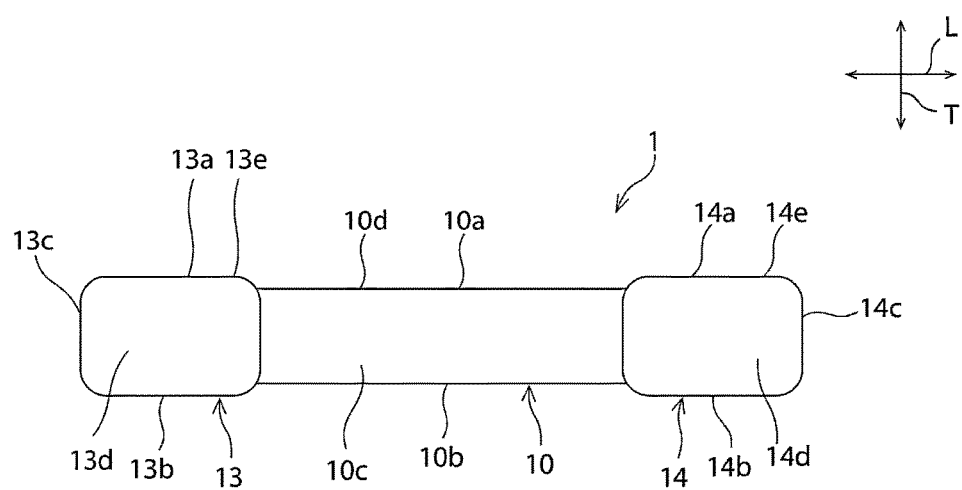
FIG. 2 is a schematic side view of the ceramic electronic component according to the first preferred embodiment of the present invention.
Figure 3:
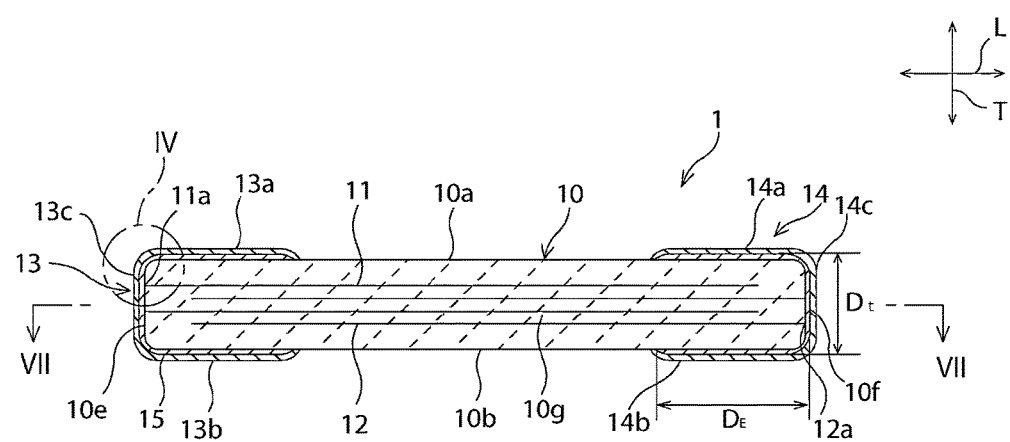
FIG. 3 is a schematic sectional view taken along line III-III of FIG. 1.
Figure 4:
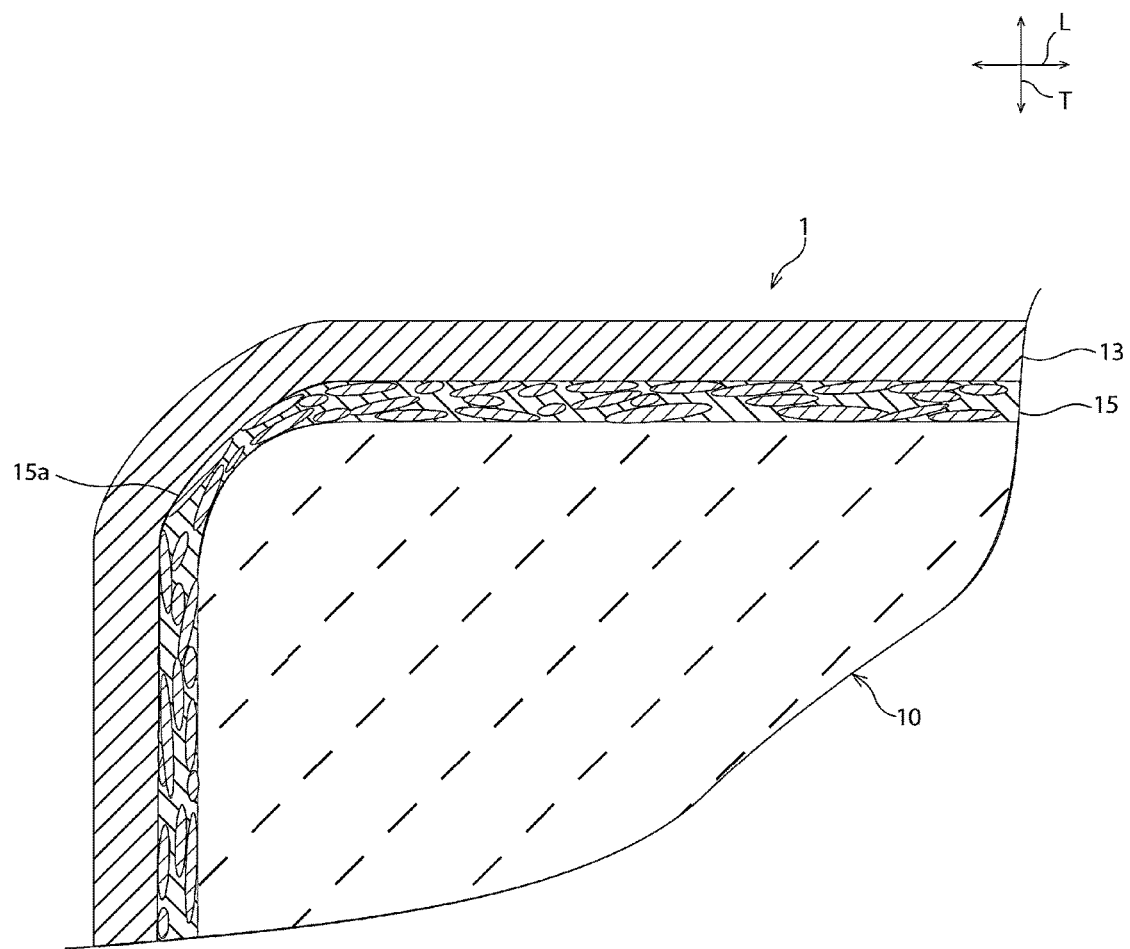
FIG. 4 is a schematic sectional view in which a portion enclosed with line IV of FIG. 3 is enlarged.
Figure 5:
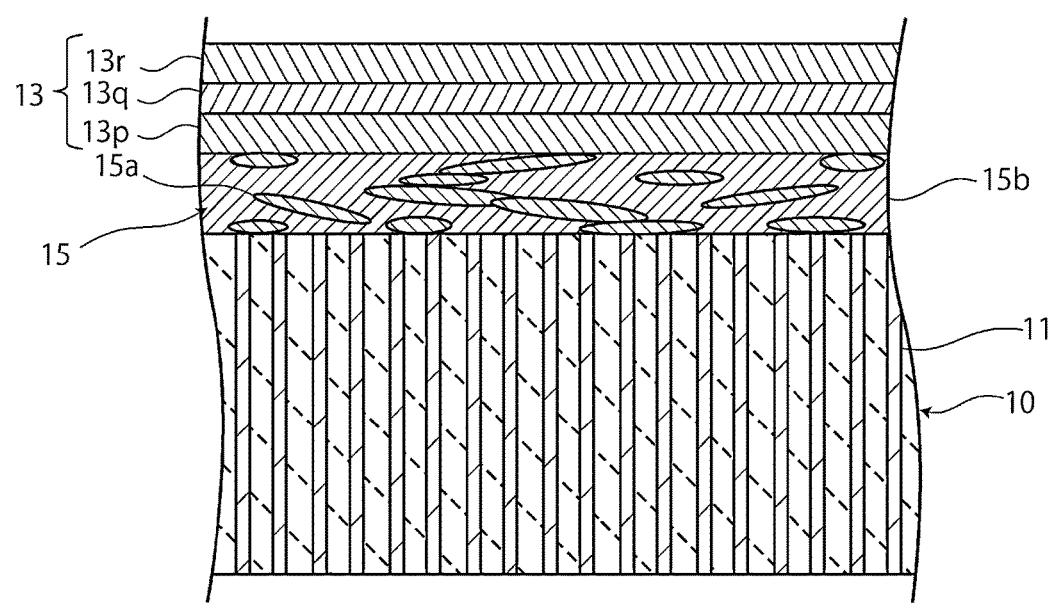
FIG. 5 is a schematic sectional view showing a glass coating layer and a first outer electrode of a ceramic electronic component produced in the first preferred embodiment of the present invention.
Figure 6:
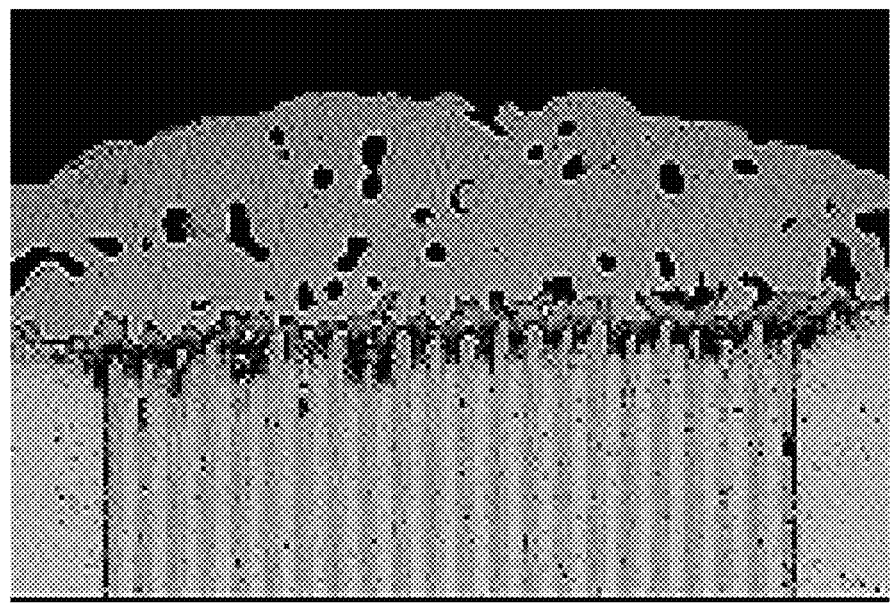
FIG. 6 is a sectional photograph of a sintered metal film formed by firing a conductive paste layer.
Figure 7:
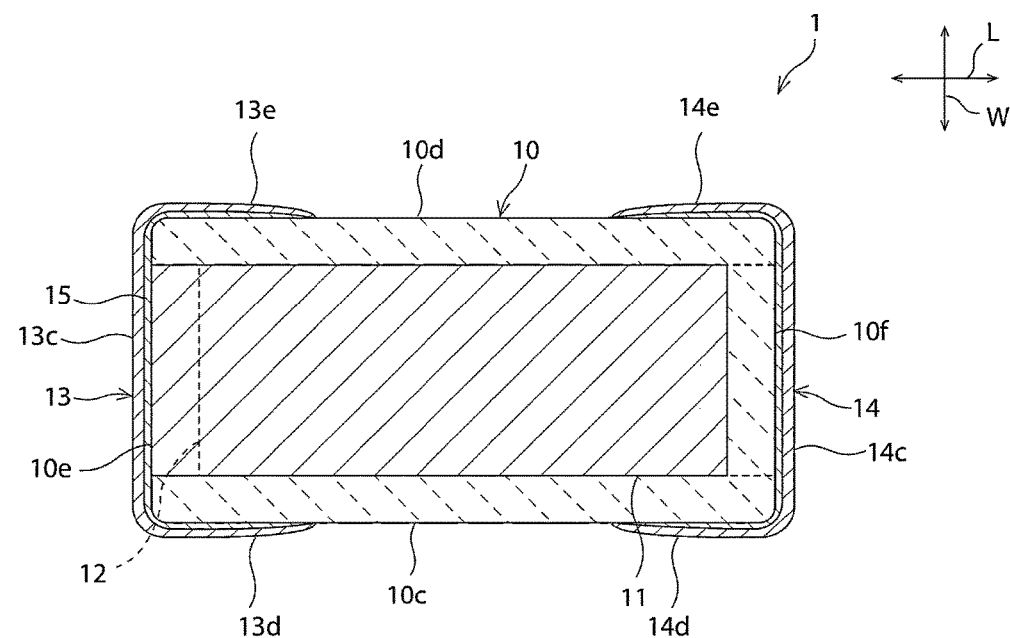
FIG. 7 is a schematic sectional view taken along line VII-VII of FIG. 3.

FIG. 1 is a schematic perspective view of a ceramic electronic component according to the first preferred embodiment of the present invention. FIG. 2 is a schematic side view of the ceramic electronic component according to this preferred embodiment. FIG. 3 is a schematic sectional view taken along line III-III of FIG. 1. FIG. 4 is a schematic sectional view in which a portion enclosed with line IV of FIG. 3 is enlarged. FIG. 5 is a schematic sectional view showing a glass coating layer and a first outer electrode of a ceramic electronic component produced in this preferred embodiment. FIG. 7 is a schematic sectional view taken along line VII-VII of FIG. 3.

A structure of a ceramic electronic component 1 will be described with reference to FIGS. 1 to 7.

As illustrated in FIGS. 1 to 3 and 7, the ceramic electronic component 1 includes a ceramic body 10. The ceramic body 10 preferably is composed of an appropriate ceramic material that provides the functions of the ceramic electronic component 1. Specifically, when the ceramic electronic component 1 is a capacitor, the ceramic body 10 can be composed of a dielectric ceramic material. Specific examples of the dielectric ceramic material include $BaTiO_3$, $CaTiO_3$, $SrTiO_3$, and $CaZrO_3$. When the ceramic body 10 contains a dielectric ceramic material, the ceramic body 10 contains the ceramic material as a main component and may also suitably contain additional components such as a Mn compound, a Mg compound, a Si compound, an Fe compound, a Cr compound, a Co compound, a Ni compound, and a rare-earth compound in accordance with desired characteristics of the ceramic electronic component 1.

The shape of the ceramic body 10 is not particularly limited. In this preferred embodiment, the ceramic body 10 preferably has a substantially rectangular parallelepiped shape. As illustrated in FIGS. 1 to 3, the ceramic body 10 includes first and second principal surfaces 10a and 10b that extend in the length direction L and the width direction W. As illustrated in FIGS. 1, 2, and 7, the ceramic body 10 includes first and second side surfaces 10c and 10d that extend in the thickness direction T and the length direction L. As illustrated in FIGS. 3 and 7, the ceramic body 10 includes first and second end surfaces 10e and 10f that extend in the thickness direction T and the width direction W.

In this specification, the "substantially rectangular parallelepiped shape" includes a rectangular parallelepiped whose corner portions and ridge portions are rounded. That is, a "substantially rectangular parallelepiped" member includes any member having first and second principal surfaces, first and second side surfaces, and first and second end surfaces. Furthermore, depressions and projections may be provided on some or all of the principal surfaces, side surfaces, and end surfaces.

The size of the ceramic body 10 is not particularly limited. When the ceramic body 10 is assumed to have a thickness $D_T$, a length $D_L$, and a width $D_W$, the ceramic body 10 may be a thin ceramic body that approximately satisfies $D_T<D_W<D_L$, $(\frac{1}{5})D_W \leq D_T \leq (\frac{1}{2})D_W$, or $D_T<0.3$ mm, for example. Specifically, $0.05$ mm $\leq D_T<0.3$ mm, $0.4$ mm $\leq D_L \leq 1$ mm, and $0.3$ mm $\leq D_W \leq 0.5$ mm may be approximately satisfied, for example.

As illustrated in FIGS. 3 and 7, the ceramic body 10 includes a plurality of first and second inner electrodes 11 and 12 each having a substantially rectangular shape and alternately disposed at regular intervals in the thickness direction T. End portions 11a and 12a of the respective first and second inner electrodes 11 and 12 are exposed at the surfaces of the ceramic body 10. Specifically, the end portion 11a, which is one of end portions of the first inner electrode 11, is exposed at the first end surface 10e of the ceramic body 10. The end portion 12a, which is one of end portions of the second inner electrode 12, is exposed at the second end surface 10f of the ceramic body 10.

The first and second inner electrodes 11 and 12 are parallel or substantially parallel to the first and second principal surfaces 10a and 10b. The first and second inner electrodes 11 and 12 face each other with a ceramic portion (ceramic layer) 10g disposed therebetween in the thickness direction T.

The thickness of the ceramic portion 10g is not particularly limited. The ceramic portion 10g can have a thickness of, for example, about 0.5 μm to about 10 μm. The thicknesses of the first and second inner electrodes 11 and 12 are also not particularly limited. The first and second inner electrodes 11 and 12 can each have a thickness of, for example, about 0.2 μm to about 2 μm.

The first and second inner electrodes 11 and 12 can be composed of an appropriate conductive material. For example, the first and second inner electrodes 11 and 12 can be composed of a metal such as Ni, Cu, Ag, Pd, or Au or an alloy containing at least one of the foregoing metals, such as a Ag—Pd alloy.

As illustrated in FIGS. 3 and 4, glass coating layers 15 are disposed on the surface of the ceramic body 10. The glass coating layers 15 cover portions of the ceramic body 10 in which the first and second inner electrodes 11 and 12 are exposed. Specifically, the glass coating layers 15 are disposed on the first and second end surfaces 10e and 10f of the ceramic body 10, on both end portions of the first and second principal surfaces 10a and 10b in the length direction L, and on both end portions of the first and second side surfaces 10c and 10d in the length direction L.

The glass coating layers 15 are respectively disposed so as to extend from exposed portions of the first and second inner electrodes 11 and 12 at the first and second end surfaces 10e and 10f to the first principal surface 10a. On the first and second end surfaces 10e and 10f sides, the dimension $D_E$ of portions of the glass coating layers 15 on the first principal surface 10a in the length direction L is larger than the dimension $D_t$ of portions of the glass coating layers 15 on the first and second end surfaces 10e and 10f in the thickness direction T.

Furthermore, the glass coating layers 15 are respectively disposed so as to extend from exposed portions of the first and second inner electrodes 11 and 12 at the first and second end surfaces 10e and 10f to the second principal surface 10b. On the first and second end surfaces 10e and 10f sides, the dimension $D_E$ of portions of the glass coating layers 15 on the second principal surface 10b in the length direction L is larger than the dimension $D_t$ of portions of the glass coating layers 15 on the first and second end surfaces 10e and 10f in the thickness direction T.

As illustrated in FIG. 5, a glass medium 15b and metal powder particles 15a are fixed in each of the glass coating layers 15. In other words, the glass coating layer 15 is a composite film formed by integrally fixing the glass medium 15b and the metal powder particles 15a. The glass medium 15b in the glass coating layer 15 is formed by melting a glass powder for forming the glass medium 15b through a heat treatment at a softening point thereof or higher and then solidifying the melted glass powder. Thus, the glass medium 15b is present so that gaps between the metal powder particles 15a are filled with the glass medium 15b. Similarly, the glass medium 15b seals the surface of the ceramic body 10 as a result of the solidification of the glass powder of the glass medium 15b. Therefore, the ceramic body 10 and the glass coating layer 15 are fixed to each other with close and strong adhesion. Furthermore, since the glass medium 15b on the surface of the ceramic body 10 is dense, the moisture resistance is improved. Consequently, the moisture resistance of the ceramic electronic component 1 is improved. FIG. 5 shows one of the cross sections, and the view may be different in other cross sections.

The content of the glass medium 15b in the glass coating layer 15 is preferably about 35% to about 75% by volume and more preferably about 40% to about 50% by volume, for example. If the content of the glass medium 15b in the glass coating layer 15 is less than about 35% by volume, the effect of improving the moisture resistance of the ceramic electronic component 1 due to the presence of the glass coating layer 15 may decrease. If the content of the glass medium 15b in the glass coating layer 15 is more than about 75% by volume, it may be difficult to form the first and second outer electrodes 13 and 14 directly above the glass coating layer 15. The glass of the glass medium 15b preferably contains at least one network forming oxide selected from the group consisting of $B_2O_3$ and $SiO_2$ and at least one network modifying oxide selected from the group consisting of $Al_2O_3$, $ZnO$, $CuO$, $Li_2O$, $Na_2O$, $K_2O$, $MgO$, $CaO$, $BaO$, $ZrO_2$, and $TiO_2$.

The glass of the glass medium 15b preferably contains, as a network modifying oxide, an oxide of the same metal as the metal powder particles 15a of the glass coating layer 15. This increases the wettability of the glass powder in the glass coating layer 15 with the metal powder particles 15a in the glass coating layer 15.

The glass of the glass medium 15b preferably contains $SiO_2$ as a component with the highest content. The content of $SiO_2$ in the entire glass is preferably about 35 mol % or more, for example.

In the glass coating layer 15, the metal powder particles 15a are dispersed in the glass medium 15b. The content of the metal powder particles 15a in the glass coating layer 15 is preferably about 25% to about 65% by volume and more preferably about 50% to about 60% by volume, for example. The metal powder particles 15a are composed of, for example, a metal such as Cu, Ni, Ag, Pd, or Au or an alloy containing at least one of the foregoing metals, such as a Ag—Pd alloy. The metal powder particles 15a preferably do not contain, as a main component, a metal contained in the first and second inner electrodes 11 and 12 as a main component. In other words, the main component of the metal powder particles 15a is preferably different from the main component of the first and second inner electrodes 11 and 12. If the metal powder particles 15a contain a metal contained in the first and second inner electrodes 11 and 12 as a main component, the content of the metal is preferably about 10% by volume or less relative to the entire volume of the metal powder particles 15a, for example.

The metal powder particles 15a preferably include a core portion composed of Cu. In this case, better conductivity is maintained. Furthermore, the interdiffusion between the first and second inner electrodes 11 and 12 and the glass coating layer 15 occurs even in a low-temperature range, which further improves the contact property between the first and second inner electrodes 11 and 12 and the glass coating layer 15. The low-temperature range specifically includes about 600° C. to 750° C., for example.

The glass coating layer 15 is different from a sintered metal film that is formed of a sintered metal and glass through firing of a conductive paste layer. In other words, the glass medium 15b is continuously formed in the glass coating layer 15 so that gaps between the metal powder particles 15a are filled with the glass medium 15b whereas a metal medium is formed in the sintered metal film. In the glass coating layer 15, not all the metal powder particles 15a are integrally sintered, and the glass medium 15b is present so that gaps between the metal powder particles 15a are filled with the glass medium 15b. On the other hand, in the case of the sintered metal film, glass is present at the interface between the sintered metal film and the ceramic body as illustrated in a photograph of FIG. 6 because a glass component is brought to the interface between the sintered metal film and the ceramic body from the inside of the sintered metal film as a result of sintering of metal powder particles. Although not confirmed from FIG. 6, glass may be present on the surface of the sintered metal film because a glass component is brought to the surface of the sintered metal film from the inside of the sintered metal film as a result of sintering of metal powder particles. In the sintered metal film formed by firing a conductive paste layer, substantially all metal powder particles are sintered and thus substantially no unsintered metal powder particles are left.

The metal powder particles 15a contain metal powder particles having an elongated or substantially elongated shape. The term "substantially elongated shape" in this specification refers to a shape in which a certain cross section of the metal powder particles 15a has a major axis and a minor axis. In this preferred embodiment, the cross section of the glass coating layer 15 in the thickness direction T contains the metal powder particles 15a having an elongated or substantially elongated shape. In the cross section of the glass coating layer 15 in the thickness direction T, the metal powder particles 15a preferably have at least one shape selected from a flat or substantially flat shape, a scaly or substantially scaly shape, a rod-like or substantially rod-like shape, and a needle-like or substantially needle-like shape.

The metal powder particles 15a having an elongated or substantially elongated shape preferably have an aspect ratio of about 4 or more and a minor axis length of about 1.5 μm or less, for example. In this case, the thickness of the metal powder particles 15a is decreased and the surface area of the metal powder particles 15a is further increased. Therefore, the metal powder particles 15a more easily enter the ridge portions of the ceramic body 10 where the amount of paste is small. Consequently, the glass coating layer 15 is appropriately formed in the ridge portions of the ceramic body 10.

If the aspect ratio is less than about 4, a variation in the thickness of the outer electrodes each constituted by a plating film increases and thus outer electrodes having a desired thickness are sometimes not formed. If the minor axis length of the metal powder particles 15a having a substantially elongated shape is more than about 1.5 μm, it may become difficult for the metal powder particles 15a to enter the ridge portions of the ceramic body 10. In this case, the glass coating layer 15 is not easily formed in the ridge portions of the ceramic body 10, which degrades the moisture resistance. In this specification, the term "aspect ratio" is a ratio of a major axis to a minor axis in a certain cross section of the metal powder particles 15a.

Figure 8:
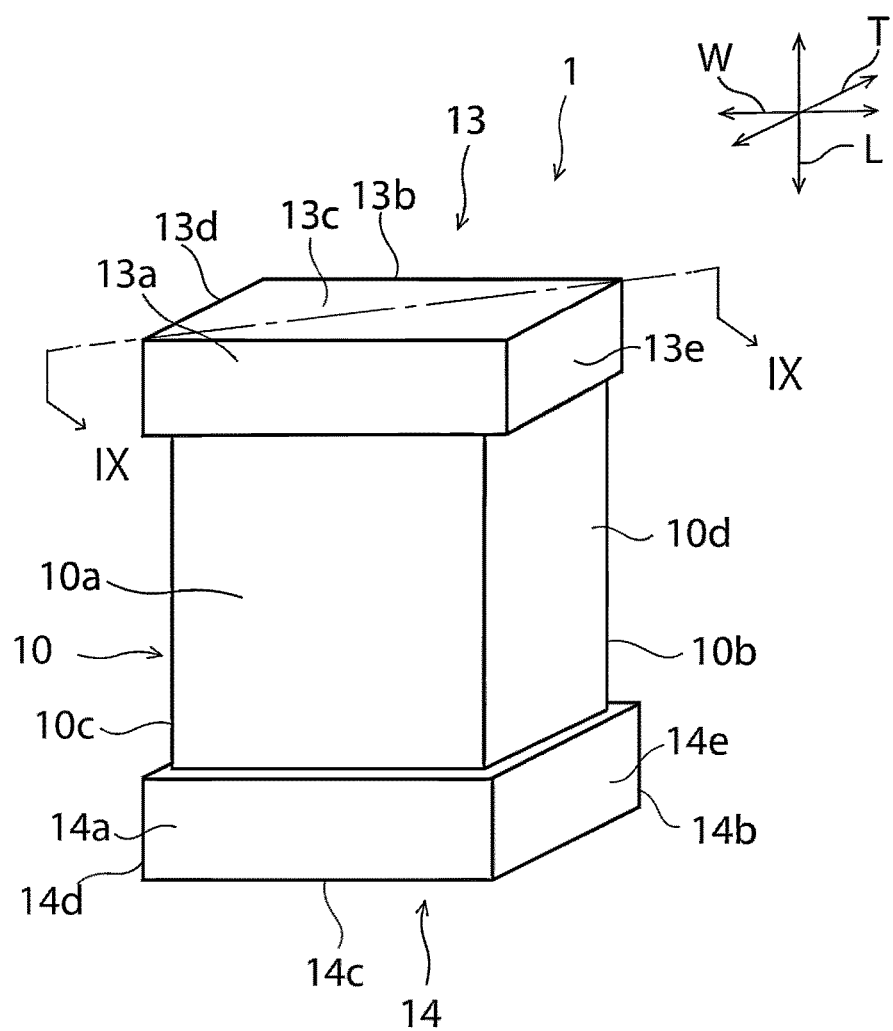
FIG. 8 is a schematic view for describing a method for measuring the aspect ratio of metal powder particles in various preferred embodiments of the present invention.
Figure 9:
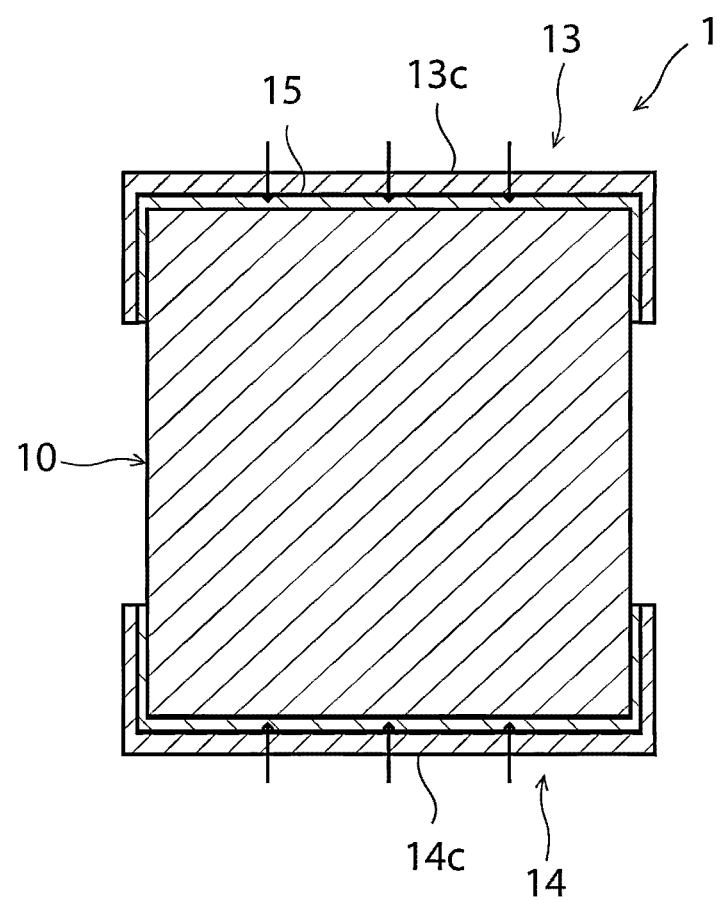
FIG. 9 is a schematic sectional view taken along line IX-IX of FIG. 8.

In various preferred embodiments of the present invention, "the aspect ratio of metal powder particles" is measured by the following method. First, polishing is performed from the ridge portion of the ceramic electronic component 1 toward a diagonal line IX-IX of the surface of a third portion 13c of the first outer electrode 13 illustrated in FIG. 8 in order to expose a cross section of the glass coating layer 15 as illustrated in FIG. 9. The cross section is then divided into four equal portions in the direction of the line IX-IX as illustrated in FIG. 9, and the glass coating layer 15 is observed at three boundaries of the four equal portions using a scanning electron microscope (SEM) with a magnification of 5000 times at an acceleration voltage of 15 kV. In the SEM observation at each of the three boundaries, the diameters of the cross sections of all the metal powder particles 15a contained in a field of view of 30 μm×30 μm are measured on the exposed cross section, and the maximum diameter among the measured diameters is used as a major axis length. The maximum thickness in a direction of an axis that is perpendicular to the major axis of the metal powder particle 15a having the maximum diameter is used as a minor axis length. The major axis length is divided by the minor axis length to calculate the aspect ratio of the metal powder particle 15a. Similarly, as indicated by arrows in FIG. 9, the aspect ratios of the metal powder particles 15a are also calculated in the glass coating layer 15 on the third portion 14c side of the second outer electrode 14. The average of the six aspect ratios of the metal powder particles 15a in total, the six aspect ratios being calculated in both the glass coating layers 15 on the first and second outer electrodes 13 and 14 sides, is defined to be an aspect ratio of the metal powder particles 15a in various preferred embodiments of the present invention. In the SEM observation, if a plurality of metal powder particles 15a are in contact with each other in the major axis direction and a single integrated metal powder particle 15a is observed, the major axis of such a single integrated body including the plurality of metal powder particles 15a is defined to be a major axis of a single metal powder particle 15a.

The average particle diameter of the metal powder particles 15a having an elongated or substantially elongated shape is preferably about 0.5 μm to about 10 μm, for example. In the present invention, the average particle diameter of the metal powder particles 15a is an average of the sum of the major axis lengths and minor axis lengths of six metal powder particles measured by the above-described method (a value obtained by dividing the sum by 12).

In the glass coating layer 15, the metal powder particles 15a having an elongated or substantially elongated shape are preferably disposed in a portion above the ridge portion defined by the first principal surface 10a and the first end surface 10e. The metal powder particles 15a having an elongated or substantially elongated shape are also preferably disposed in a portion above the ridge portion defined by the second principal surface 10b and the first end surface 10e. The metal powder particles 15a having an elongated or substantially elongated shape are also preferably disposed in a portion above the ridge portion defined by the first principal surface 10a and the second end surface 10f. The metal powder particles 15a having an elongated or substantially elongated shape are also preferably disposed in a portion above the ridge portion defined by the second principal surface 10b and the second end surface 10f.

The metal powder particles 15a define conductive paths that electrically connect the first and second inner electrodes 11 and 12 to the first and second outer electrodes 13 and 14, respectively. At least one of the conductive paths is preferably formed by bringing a plurality of metal powder particles 15a into contact with each other, the metal powder particles 15a being arranged in the thickness direction T of the glass coating layer 15.

In the cross section of the glass coating layer 15 in the thickness direction T, the surfaces of the metal powder particles 15a that define the conductive paths may be nonlinear. The conductive paths may include a plurality of relatively narrow portions and a plurality of relatively thick portions.

The length of the major axis of the metal powder particles 15a that have an elongated or substantially elongated shape and form the conductive paths is preferably larger than or equal to the thickness of the glass coating layer 15 and more preferably about 1.5 times or more the thickness of the glass coating layer 15, for example. In this case, the metal powder particles 15a tend to be exposed at the surface of the glass coating layer 15, and thus outer electrodes each constituted by a plating film are more easily formed.

The glass coating layer 15 preferably has a thickness such that at least one of the metal powder particles 15a that have an elongated or substantially elongated shape and are disposed in the portion above the ridge portion of the glass coating layer 15 is exposed at the surface of the glass coating layer 15. In this case, the exposed area of the metal powder particles 15a is further increased. In other words, the coverage with the outer electrode constituted by a plating film is further increased, and thus the outer electrode constituted by a plating film is easily formed.

The glass coating layer 15 preferably has a thickness of about 1 μm to about 10 μm, for example. If the glass coating layer 15 has a thickness of less than about 1 μm, the effect of improving the moisture resistance of the ceramic electronic component 1 due to the presence of the glass coating layer 15 may decrease. If the glass coating layer 15 has a thickness of more than about 10 μm, the absolute quantity of glass contained in the glass coating layer 15 increases. This easily causes the liquid phase diffusion of components of the first and second inner electrodes 11 and 12 into molten glass of the glass coating layer 15. In such a case, the tips of the first and second inner electrodes 11 and 12 become narrow and gaps are formed between the first and second inner electrodes 11 and 12 and the ceramic portion 10g, which may degrade the moisture resistance of the ceramic electronic component 1.

The thickness of the glass coating layer 15 can be measured by, for example, the following method. That is, the first side surface 10c of the ceramic electronic component 1 is polished in the width direction W until the cross section of the central portion (½W) of the ceramic electronic component 1 appears, and the thickness of the glass coating layer 15 located at the center of the end surface of the outer electrode in the obtained cross section is observed with an optical microscope.

Portions of the first and second inner electrodes 11 and 12 may protrude from the surface of the ceramic body 10 and enter the glass coating layers 15, but preferably do not penetrate through the glass coating layers 15.

The first outer electrode 13 is disposed directly above the glass coating layer 15. The first outer electrode 13 is electrically connected to the first inner electrode 11 through the conductive paths provided in the glass coating layer 15. The first outer electrode 13 includes a first portion 13a located on the first principal surface 10a, a second portion 13b located on the second principal surface 10b, a third portion 13c located on the first end surface 10e, a forth portion 13d located on the first side surface 10c, and a fifth portion 13e located on the second side surface 10d.

The second outer electrode 14 is disposed directly above the glass coating layer 15. The second outer electrode 14 is electrically connected to the second inner electrode 12 through the conductive paths provided in the glass coating layer 15. The second outer electrode 14 includes a first portion 14a located on the first principal surface 10a, a second portion 14b located on the second principal surface 10b, a third portion 14c located on the second end surface 10f, a forth portion 14d located on the first side surface 10c, and a fifth portion 14e located on the second side surface 10d.

The first and second outer electrodes 13 and 14 each preferably include a plating film. The plating film is preferably composed of at least one metal selected from the group consisting of Cu, Ni, Sn, Pd, Au, Ag, Pt, Bi, and Zn or an alloy containing at least one of the foregoing metals. The first and second outer electrodes 13 and 14 may each include a single plating film or two or more plating films. For example, the first and second outer electrodes 13 and 14 may have a two-layer structure of Ni—Sn or a three-layer structure of Cu—Ni—Sn. In this preferred embodiment, as illustrated in FIG. 5, the first and second outer electrodes 13 and 14 each preferably include a first layer 13p composed of Cu, a second layer 13q composed of Ni, and a third layer 13r composed of Sn.

The total thickness of the glass coating layer 15 and the first outer electrode 13 and the total thickness of the glass coating layer 15 and the second outer electrode 14 are each preferably about 15 μm to about 25 μm, for example.

An example of a method for producing the ceramic electronic component 1 according to this preferred embodiment will now be described.

Figure 10:
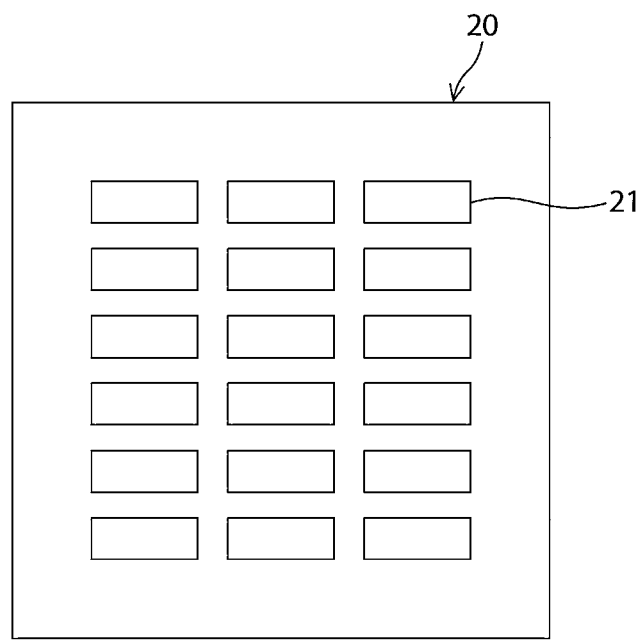
FIG. 10 is a schematic plan view of a ceramic green sheet on which a conductive pattern has been formed.

A ceramic green sheet 20 containing a ceramic material and used to form a ceramic body 10 is prepared (refer to FIG. 10). As illustrated in FIG. 10, a conductive paste is then applied onto the ceramic green sheet 20 to form a conductive pattern 21. The conductive paste can be applied by, for example, a printing method such as a screen printing method. The conductive paste preferably includes conductive fine particles and may further include a publicly known binder or solvent.

Subsequently, a plurality of ceramic green sheets 20 on which the conductive pattern 21 is not provided, a ceramic green sheet 20 on which the conductive pattern 21 having a shape corresponding to the first or second inner electrode 11 or 12 has been formed, and a plurality of ceramic green sheets 20 on which the conductive pattern 21 is not formed are stacked in that order and pressed in the stacking direction to produce a mother multilayer body.

Subsequently, a plurality of green ceramic multilayer bodies are produced from the mother multilayer body by cutting the mother multilayer body along an imaginary cutting line.

The mother multilayer body can be cut by dicing or press-cutting. The green ceramic multilayer bodies may be subjected to barrel polishing or the like to round the ridge portions and corner portions.

Subsequently, each of the green ceramic multilayer bodies is fired. In this firing step, the first and second inner electrodes 11 and 12 are fired. The firing temperature can be appropriately set in accordance with the types of ceramic material and conductive paste used. The firing temperature preferably is, for example, about 900° C. to about 1300° C.

Subsequently, a glass paste is applied onto the fired ceramic multilayer body by dipping or the like. A glass powder is then melted through the heat treatment of the glass paste and cooled to form a glass medium 15b. Thus, a glass coating layer 15 is provided. The glass paste used to form the glass coating layer 15 contains glass powder particles, metal powder particles 15a having an elongated or substantially elongated shape, a binder, a solvent, and the like. In this preferred embodiment, the glass paste contains the metal powder particles 15a having an elongated or substantially elongated shape. Therefore, the glass paste is continuously applied even in the ridge portions of the ceramic body 10. Furthermore, the metal powder particles having an elongated or substantially elongated shape are present even in the ridge portions. Consequently, a plating film is present even in the ridge portions of the ceramic body 10 and preferably is formed by the plating process described below. The particle diameter of the glass powder particles is preferably smaller than that of the metal powder particles 15a. The heat treatment temperature is preferably a temperature which is higher than or equal to the softening point of the glass powder particles and at which the metal powder particles 15a are not sintered.

For example, the heat treatment temperature is preferably about 600° C. to about 750° C. If the heat treatment temperature is lower than about 600° C., the glass is not softened, which may degrade the adhesiveness with the ceramic body 10. If the heat treatment temperature is higher than about 750° C., a reaction between the ceramic body 10 and the glass coating layer starts and the glass coating layer 15 may disappear. Furthermore, a ceramic component in the ceramic body 10 diffuses into the glass in the glass coating layer 15 and a reaction layer is formed near the surface of the ceramic body 10, which may degrade the mechanical strength of the ceramic body 10. This may be because the reaction layer is easily dissolved with a plating solution and thus chemical erosion occurs when a plating film is formed on the glass coating layer 15.

Subsequently, the glass coating layer 15 is plated to form first and second outer electrodes 13 and 14. Through the above processes, a ceramic electronic component 1 is produced.

An example in which samples of the ceramic electronic component 1 according to this preferred embodiment were actually produced will now be described. Note that 40 samples were produced for each of samples 1 to 10 shown in Tables 1 and 2.

Size of a ceramic body 10 (design value): L×W×T=1.0 mm×0.5 mm×0.10 mm and L×W×T=1.0 mm×0.5 mm×0.17 mm (two sizes)

Dimension $D_E$ of a portion of a glass coating layer 15 in the length direction L, the portion being located on a first principal surface 10a of the ceramic body 10 having a size (design value) of L×W×T=1.0 mm×0.5 mm×0.10 mm: 280 µm Dimension $D_T$ of a portion of a glass coating layer 15 in the thickness direction T, the portion being located on a first end surface 10e of the ceramic body 10 having a size (design value) of L×W×T=1.0 mm×0.5 mm×0.10 mm: 116 µm Dimension $D_E$ of a portion of a glass coating layer 15 in the length direction L, the portion being located on a first principal surface 10a of the ceramic body 10 having a size (design value) of L×W×T=1.0 mm×0.5 mm×0.17 mm: 280 µm Dimension $D_T$ of a portion of a glass coating layer 15 in the thickness direction T, the portion being located on a first end surface 10e of the ceramic body 10 having a size (design value) of L×W×T=1.0 mm×0.5 mm×0.17 mm: 186 µm Ceramic material: $BaTiO_3$ Thickness (design value) of a ceramic portion 10g after firing: 0.90 µm Material of inner electrodes: Ni Thickness (design value) of inner electrodes after firing: 0.6 µm Total number of inner electrodes: 45

Firing conditions: holding at 1200° C. for 2 hours Capacitance (design value) of a ceramic electronic component: 0.47 µF Rated working voltage (design value) of a ceramic electronic component: 6.3 V Thickness (design value) of a glass coating layer 15: 8 µm Metal powder particles contained in a glass coating layer 15: Cu flat powder particles and Cu spherical powder particles Minor axis length of Cu flat powder particles: shown in Tables 1 and 2

Main component of glass powder particles in glass paste: borosilicate glass

Softening point of glass in glass paste: 600° C.

Average particle diameter of glass powder particles: 1 µm

Heat treatment condition: 680° C.

Plating film: Cu film (thickness: 4 µm), Ni film (thickness: 3 µm), and Sn film (thickness: 4 µm) on glass coating layer 15

Ratio of Cu flat powder particles and glass in a glass coating layer 15: 62.8 vol %/37.2 vol % (preparation value)

Ratio of Cu powder particles and glass powder particles in solid content of glass paste: 57.5 vol %/42.5 vol % (preparation value)

Evaluation of Ease of Formation of Plating Film in Ridge Portion of Ceramic Body A glass coating layer 15 was formed by dipping the ceramic body 10 produced under the above conditions into a glass paste. After that, a process of forming a plating film was conducted and whether the plating film was formed in the ridge portions was checked. In the formation of the glass coating layer 15, the viscosity of the glass paste was adjusted so that the glass coating layer 15 had a thickness of about 8 µm, for example.

Whether the plating film was formed in the ridge portions of the ceramic body was evaluated to be as follows. First, the formation of the plating film was checked by visually inspecting the entire ridge portions of each sample. Next, in each sample, a surface (LT surface) extending in the length direction L and thickness direction T was polished until the dimension (W dimension) in the width direction W was halved in order to obtain a cross section. The ridge portions of the ceramic body in the obtained cross section were observed using an optical microscope (50 times). Samples in which it was confirmed by at least one of the visual inspection and the cross section observation that the plating film was not formed in the ridge portions were treated as "not good samples". Tables 1 and 2 show the results.

The minor axis length of the metal powder particles 15a having an elongated or substantially elongated shape is a value obtained when the aspect ratio was calculated.

TABLE 1

| Size of ceramic body 1.0 mm × 0.5 mm × 0.10 mm | Sample 1 | Sample 2 | Sample 3 | Sample 4 | Sample 5 |
| --- | --- | --- | --- | --- | --- |
| Aspect ratio | 1 | 2.5 | 4 | 6 | 9 |
| Minor axis length of Cu flat powder particles (μm) | 3.5 | 2.1 | 1.5 | 0.9 | 0.5 |
| Number of "not good samples" | 9/40 | 3/40 | 0/40 | 0/40 | 0/40 |

TABLE 2

| Size of ceramic body 1.0 mm × 0.5 mm × 0.17 mm | Sample 6 | Sample 7 | Sample 8 | Sample 9 | Sample 10 |
| --- | --- | --- | --- | --- | --- |
| Aspect ratio | 1* | 2.5 | 4 | 6 | 9 |
| Minor axis length of Cu flat powder particles (μm) | 3.5 | 2.1 | 1.5 | 0.9 | 0.5 |
| Number of "not good samples" | 7/40 | 2/40 | 0/40 | 0/40 | 0/40 |

As described above, in this preferred embodiment, the metal powder particles 15a contained in the glass coating layer 15 have an elongated or substantially elongated shape. Therefore, even when the dimension $D_E$ of a portion of the glass coating layer 15 in the length direction L, the portion being located on the first principal surface 10a, is larger than the dimension $D_T$ of a portion of the glass coating layer 15 in the thickness direction T, the portion being located on the first end surface 10e, the metal powder particles 15a are easily disposed in the ridge portions of the ceramic body 10. Consequently, the glass coating layer 15 containing the metal powder particles 15a having an elongated or substantially elongated shape is favorably formed in the ridge portions. In particular, even when a glass paste is thinly applied onto the first principal surface 10a, the glass coating layer 15 containing the metal powder particles 15a having an elongated or substantially elongated shape is favorably formed in the ridge portions. Thus, a plating film is also favorably formed in the ridge portions. Accordingly, a thin ceramic electronic component 1 having excellent moisture resistance is provided.

Furthermore, when the aspect ratio of the metal powder particles 15a is about 4 or more and the minor axis length of the metal powder particles 15a is about 1.5 μm or less, for example, the above-described effects are more significantly achieved.

Other examples of preferred embodiments of the present invention will now be described. In the following description, members having the same or substantially the same functions as those in the first preferred embodiment are denoted by the same reference numerals and the descriptions thereof are omitted.

Second Preferred Embodiment

Figure 11:
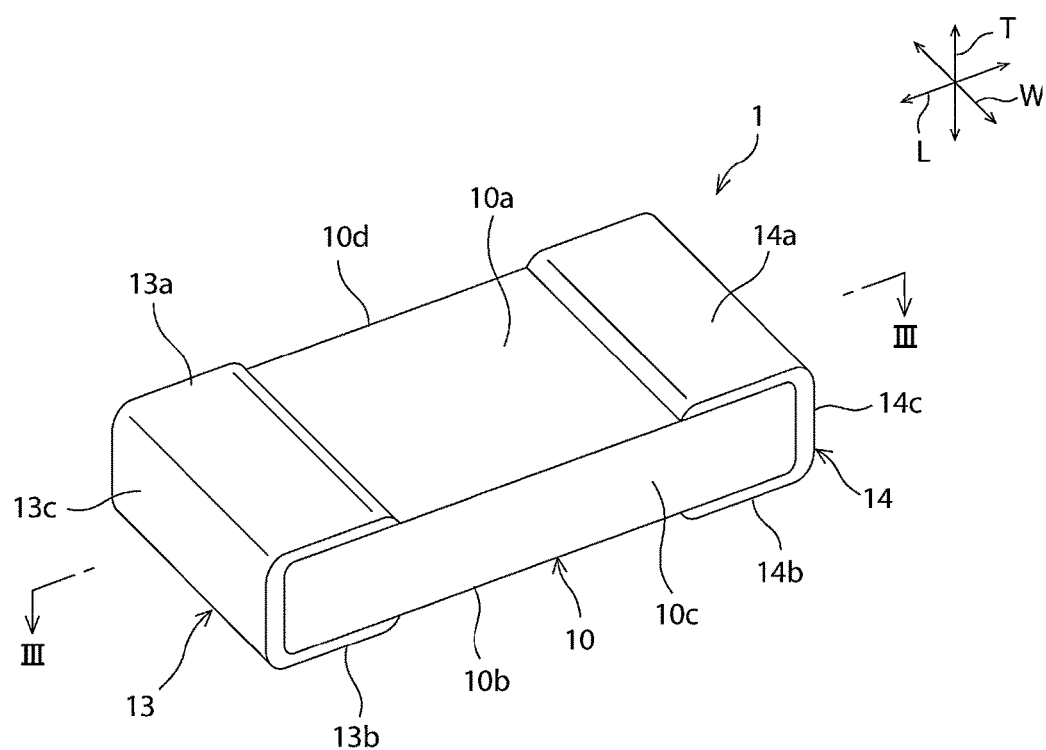
FIG. 11 is a schematic perspective view of a ceramic electronic component according to a second preferred embodiment of the present invention.

FIG. 11 is a schematic perspective view of a ceramic electronic component according to a second preferred embodiment of the present invention.

In the first preferred embodiment, an example in which the first and second outer electrodes 13 and 14 and the glass coating layers 15 are preferably located on the first and second side surfaces 10c and 10d has been described. However, as illustrated in FIG. 11, the first and second outer electrodes 13 and 14 and the glass coating layers 15 are not necessarily located on the first and second side surfaces 10c and 10d.

Figure 12:
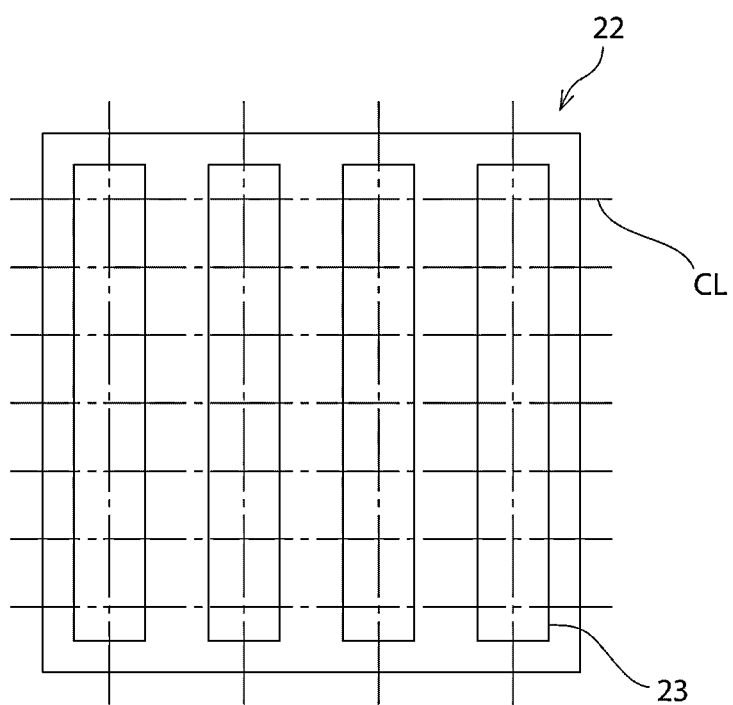
FIG. 12 is a schematic plan view of a mother multilayer body.

The ceramic electronic component according to the second preferred embodiment can be produced by, for example, the following method. A mother multilayer body 22 (refer to FIG. 12) is obtained in the same manner as the method for producing the ceramic electronic component 1 according to the first preferred embodiment. In this preferred embodiment, as illustrated in FIG. 12, a conductive pattern 23 having a shape corresponding to first and second portions 13a, 13b, 14a, and 14b of the first and second outer electrodes 13 and 14 is then formed on the mother multilayer body 22 by an appropriate printing method such as a screen printing method. A plurality of green ceramic multilayer bodies are produced from the mother multilayer body 22 by cutting the mother multilayer body 22 along an imaginary cutting line CL.

Subsequently, each of the green ceramic multilayer bodies is fired. A glass paste is then applied onto both end surfaces of the ceramic multilayer body. The glass paste is then heat-treated to form a glass coating layer 15 having a shape corresponding to each of third portions 13c and 14c of the first and second outer electrodes 13 and 14. After that, plating films are formed on the glass coating layers 15 to form the first and second outer electrodes 13 and 14. Thus, a ceramic electronic component according to the second preferred embodiment is produced.

The conductive pattern 23 provided in the first and second portions 13a, 13b, 14a, and 14b of the first and second outer electrodes 13 and 14 is different from the glass paste applied in the third portions 13c and 14c of the first and second outer electrodes 13 and 14 in terms of the types of metal and inorganic filler. For example, the conductive pattern 23 contains Ni and the same ceramic material as the ceramic material contained in the ceramic body 10.

Third Preferred Embodiment

Figure 13:
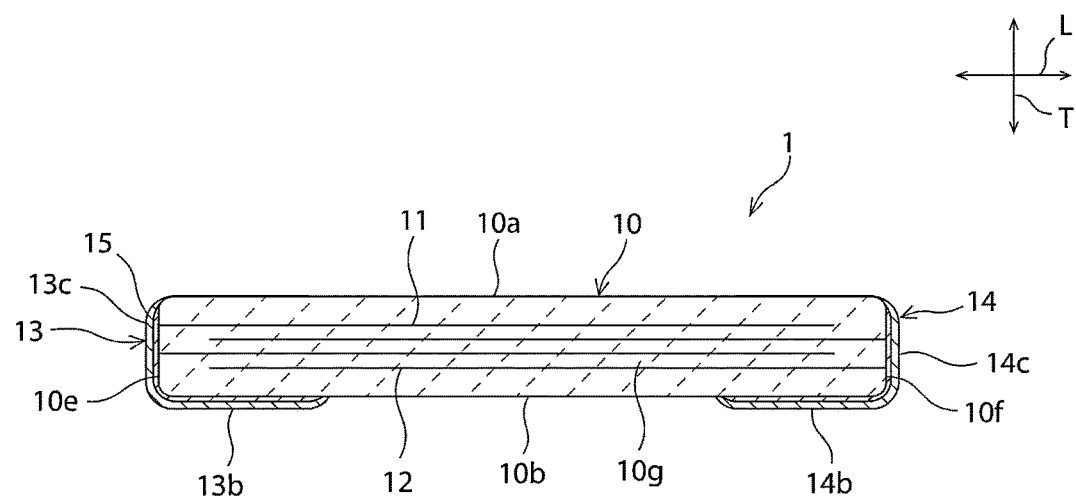
FIG. 13 is a schematic sectional view of a ceramic electronic component according to a third preferred embodiment of the present invention.

FIG. 13 is a schematic sectional view of a ceramic electronic component according to a third preferred embodiment of the present invention.

In the first preferred embodiment, an example in which the first and second outer electrodes 13 and 14 and the glass coating layers 15 are preferably located on the first and second principal surfaces 10a and 10b has been described. However, the present invention is not limited to the structure. The first and second outer electrodes 13 and 14 and the glass coating layers 15 may each be located on any portion on the surface of the ceramic body 10.

For example, as illustrated in FIG. 13, the first and second outer electrodes 13 and 14 and the glass coating layers 15 may be located on only the second principal surface 10b among the first and second principal surfaces 10a and 10b.

Fourth Preferred Embodiment

Figure 14:
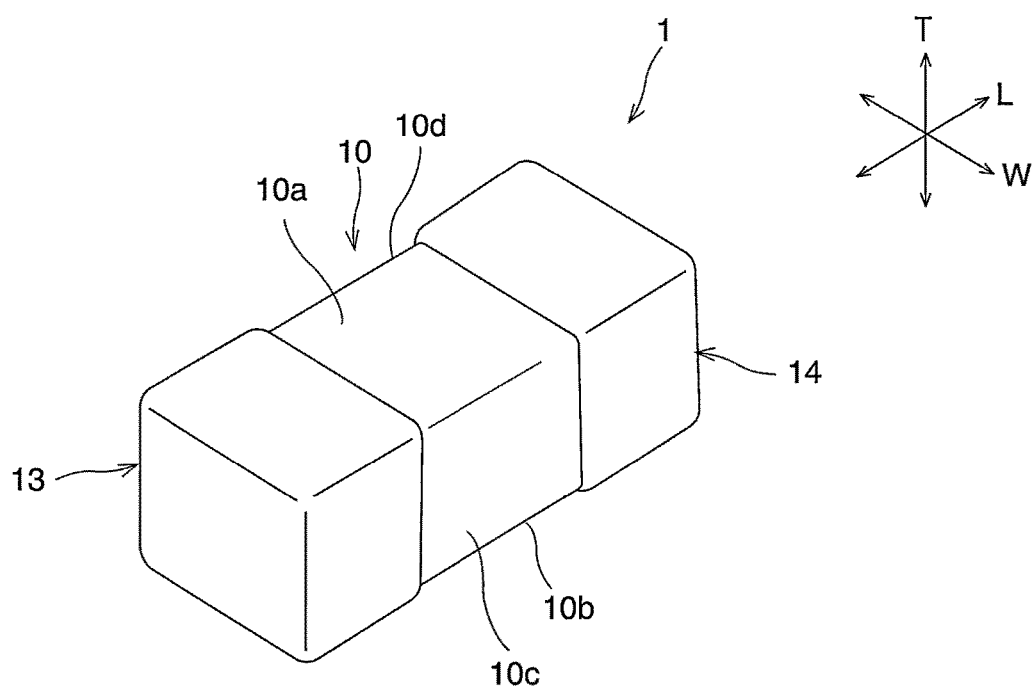
FIG. 14 is a schematic perspective view of a ceramic electronic component according to a fourth preferred embodiment of the present invention.

FIG. 14 is a schematic perspective view of a ceramic electronic component according to a fourth preferred embodiment of the present invention.

In the first preferred embodiment, an example in which, when the ceramic body 10 is assumed to have a thickness $D_T$, a length $D_L$, and a width $D_W$, $D_T<D_W<D_L$ preferably is satisfied has been described. However, as illustrated in FIG. 14, $D_W \leq D_T<D_L$ may be satisfied, for example.

As described above, various preferred embodiments of the present invention provide a ceramic electronic component having excellent moisture resistance because portions of a ceramic body in which inner electrodes are exposed are each covered with a glass coating layer.

Thus, since portions of a ceramic body in which inner electrodes are exposed are each covered with a glass coating layer, preferred embodiments of the present invention can be widely applied to various multilayer electronic components.

For example, when the ceramic electronic component is a piezoelectric ceramic element, the ceramic body can be formed of a piezoelectric ceramic material. A specific example of the piezoelectric ceramic material is a lead zirconate titanate (PZT) ceramic material.

When the ceramic electronic component is a thermistor element, the ceramic body can be formed of a semiconductor ceramic material. A specific example of the semiconductor ceramic material is a spinel-type ceramic material.

When the ceramic electronic component is an inductor element, the ceramic body can be formed of a magnetic ceramic material. A specific example of the magnetic ceramic material is a ferrite ceramic material.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic electronic component comprising:
   a ceramic body including first and second principal surfaces extending in a length direction and a width direction, first and second side surfaces extending in the length direction and a thickness direction, and first and second end surfaces extending in the width direction and the thickness direction;
   an inner electrode disposed inside the ceramic body and including an exposed portion at the first end surface;
   a glass coating layer disposed so as to extend from the exposed portion of the inner electrode at the first end surface to the first principal surface; and
   an outer electrode including a plating film disposed directly above the glass coating layer; wherein
   the glass coating layer includes a glass medium and metal powder particles that are dispersed in the glass medium and define conductive paths which electrically connect the inner electrode and the outer electrode;
   a dimension of a portion of the glass coating layer located on the first principal surface and extending in the length direction; is larger than a dimension of a portion of the glass coating layer located on the first end surface and extending in the thickness direction from the first principal surface to the second principal surface of the ceramic body; and
   the metal powder particles include metal powder particles having an elongated or substantially elongated shape.

2. The ceramic electronic component according to claim 1, wherein the metal powder particles having the elongated or substantially elongated shape are disposed in a portion of the glass coating layer above a ridge portion defined by the first principal surface and the first end surface.

3. The ceramic electronic component according to claim 2, wherein at least one of the metal powder particles having the elongated or substantially elongated shape and disposed in the portion of the glass coating layer above the ridge portion has a thickness such that the at least one of the metal powder particles is exposed at a surface of the glass coating layer.

4. The ceramic electronic component according to claim 1, wherein the metal powder particles have at least one shape selected from a flat or substantially flat shape, a scaly or substantially scaly shape, a rod or substantially rod shape, and a needle or substantially needle shape.

5. The ceramic electronic component according to claim 1, wherein the metal powder particles having the elongated or substantially elongated shape have an aspect ratio of about 4 or more and a minor axis length of about 1.5 µm or less.

6. The ceramic electronic component according to claim 1, wherein at least one of the conductive paths is defined by the metal powder particles arranged in contact with each other in the thickness direction of the glass coating layer.

7. The ceramic electronic component according to claim 1, wherein the metal powder particles do not contain, as a main component, a metal contained in the inner electrode as a main component.

8. The ceramic electronic component according to claim 1, wherein the metal powder particles include a core portion including copper.

9. The ceramic electronic component according to claim 1, wherein the glass coating layer has a thickness of about 1 µm to about 10 µm.

10. The ceramic electronic component according to claim 1, wherein in a cross section of the glass coating layer in the thickness direction, surfaces of the metal powder particles that define the conductive paths are nonlinear.

11. The ceramic electronic component according to claim 1, wherein the conductive paths include a plurality of relatively narrow portions and a plurality of relatively thick portions that are thicker than the plurality of relatively narrow portions.

12. The ceramic electronic component according to claim 1, wherein a portion of the plating film in contact with the glass coating layer is a copper plating film or a nickel plating film.

13. The ceramic electronic component according to claim 1, wherein the outer electrode and the glass coating layer are located on at least one of the first and second side surfaces.

14. The ceramic electronic component according to claim 2, wherein the outer electrode and the glass coating layer are located on at least one of the first and second side surfaces.

15. The ceramic electronic component according to claim 1, wherein the outer electrode includes a conductive pattern made of a material that is different from a material used for the glass coating layer.

16. The ceramic electronic component according to claim 1, wherein the outer electrode and the glass coating layer are located on at least one of the first and second principal surfaces.

17. The ceramic electronic component according to claim 1, wherein the outer electrode and the glass coating layer are located only on the second principal surface.

18. The ceramic electronic component according to claim 1, wherein the ceramic body has a thickness DT, a length DL, and a width DW such that DT<DW<DL.

19. The ceramic electronic component according to claim 1, wherein the ceramic body has a thickness DT, a length DL, and a width DW such that DW≤DT<DL.

20. The ceramic electronic component according to claim 1, wherein the ceramic electronic component is a piezoelectric ceramic element, a thermistor element, or an inductor element.

* * * * *